(12) United States Patent
Priewasser (10) Patent No.: US 8,026,153 B2
(45) Date of Patent: Sep. 27, 2011

(54) WAFER PROCESSING METHOD

(75) Inventor: Karl Priewasser, Munich (DE)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/722,744

(22) Filed: Mar. 12, 2010

(65) Prior Publication Data

US 2010/0255657 A1   Oct. 7, 2010

(30) Foreign Application Priority Data

Apr. 2, 2009   (JP) .................................. 2009-090166

(51) Int. Cl.
*H01L 21/00*   (2006.01)

(52) U.S. Cl. .. 438/462; 438/463; 438/464; 257/E21.599

(58) Field of Classification Search ... 257/E21.133–135; 438/462–464
See application file for complete search history.

(56) References Cited

U.S. PATENT DOCUMENTS

| | | | |
|---|---|---|---|
| 6,297,131 B1 * | 10/2001 | Yamada et al. | 438/464 |
| 2007/0123002 A1 * | 5/2007 | Norimoto et al. | 438/464 |

FOREIGN PATENT DOCUMENTS

JP   2007-019379   1/2007

* cited by examiner

*Primary Examiner* — Charles Garber
*Assistant Examiner* — Yasser Abdelaziez
(74) *Attorney, Agent, or Firm* — Greer, Burns & Crain, Ltd (57) ABSTRACT

A wafer processing method of dividing a wafer into individual devices, the wafer having on a front surface a device area and an external circumferential redundant area surrounding the device area, the method including: a wafer grinding step in which, in the state where the wafer is held on the side of a protection tape stuck to the front surface of the wafer, a rear side of the device area in a rear surface of the wafer is ground to form a recessed portion to form a ringlike reinforcing portion on an outer circumferential side of the recessed portion; a metal film coating step for coating, with a metal film, a rear surface of the wafer stuck with the protection tape on the front surface; and a wafer dividing step for cutting the predetermined dividing lines from a rear surface side of the wafer stuck with the protection tape on the front surface, thereby dividing the wafer into the individual devices.

5 Claims, 11 Drawing Sheets

WAFER PROCESSING METHOD

BACKGROUND OF THE INVENTION

1. Field of the Invention

The present invention relates to a wafer processing method of grinding a rear surface of a wafer and dividing the wafer into individual devices.

2. Description of the Related Art

A wafer formed with a plurality of devices such as ICs is ground from the rear surface to have a given thickness and then divided by a dicing device or the like into individual devices, which are used in various electronic devices. In recent years, to make it possible to reduce the weight and size of electronic devices, a wafer has been formed by grinding to be as extremely thin as 100 to 20 µm. However, the wafer is formed thin to become soft, which poses problems for subsequent conveyance and of making it difficult to cover a ground surface with a metal film such as gold, silver, titanium or the like with a thickness of several tens nm for electrically testing devices.

To eliminate such problems, the following wafer processing method has been proposed and a patent application has been made by the present applicant (e.g. Japanese Patent Laid-open No. 2007-19379). In this method, a protection tape is stuck to the front surface of the wafer, and only a portion, of the rear surface of the wafer, corresponding to the rear side of the device area is ground to form a thick ringlike reinforcing portion on the outer circumferential side thereof. This can facilitate the conveyance of the wafer and make it easy to perform the subsequent metal film forming step. In the invention described in Japanese Patent Laid-open No. 2007-19379, the metal film is coated on the rear side of the device area with the ringlike reinforcing portion having been formed. Thereafter, the rear surface of the ringlike reinforcing portion is ground to make the rear surface of the wafer flat. Alternatively, after the ringlike reinforcing portion is cut and removed, the protection tape is peeled from the front surface of the wafer and a dicing tape is stuck to the rear surface for dicing, whereby the wafer is divided into individual devices.

SUMMARY OF THE INVENTION

The metal film is coated on the rear surface of the wafer formed with the ringlike reinforcing portion. Thereafter, it is difficult, however, to make the rear side of the device area flush with the rear side of the outer circumferential redundant area by grinding only the rear surface of the ringlike reinforcing portion without any damage to the metal film on the rear surface of the device area. In addition, to perform work of removing the ringlike reinforcing portion and of peeling the protection tape from the front surface of the wafer and sticking the dicing tape to the rear surface also causes reduced productivity.

Accordingly, it is an object of the present invention to provide a wafer processing method of efficiently dividing a wafer into individual devices without any damage to a metal film deposited on a rear side of a device area of a wafer front surface in dividing into the individual devices the wafer in which a recessed portion is formed at a portion, of a rear surface of the wafer, corresponding to the rear side of the device area, a ringlike reinforcing portion is formed on the circumference of the recessed portion and the metal film is coated on the rear surface.

In accordance with an aspect of the present invention, there is provided a wafer processing method of dividing a wafer into individual devices, the wafer having on a front surface a device area sectioned by predetermined dividing lines to form a plurality of the devices and an external circumferential redundant area surrounding the device area, the wafer processing method including: a wafer grinding step in which, in a state where the wafer is held on a side of a protection tape stuck to the front surface of the wafer, a rear side of the device area in a rear surface of the wafer is ground to form a recessed portion and a ringlike reinforcing portion on an outer circumferential side of the recessed portion; a metal film coating step for coating, with a metal film, a rear surface of the wafer stuck with the protection tape on the front surface; and a wafer dividing step for cutting the predetermined dividing lines from a rear surface side of the wafer stuck with the protection tape on the front surface and dividing the wafer into individual devices.

Preferably, the wafer dividing step is performed after the protection tape stuck to the front surface of the wafer has been stuck to a dicing tape supported by a dicing frame. The wafer dividing step can be performed by cutting the predetermined cutting lines by means of a cutting blade or a laser beam.

Preferably, the wafer dividing step is performed after the ringlike reinforcing portion has been removed from the wafer. A notch is sometimes formed in an outer circumferential portion on an extension of the predetermined dividing line before the wafer dividing step so that the predetermined dividing line can be detected from the rear surface side of the wafer.

In the present invention, a laser beam or the cutting blade is applied from the rear surface side of the wafer for cutting; therefore, it is not necessary to peel the protection tape stuck to the front surface of the wafer and also to remove the ring like reinforcing portion. Thus, the wafer can efficiently be divided into individual devices without any damage to the metal film coated on the rear side of the device area in the rear surface of the wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
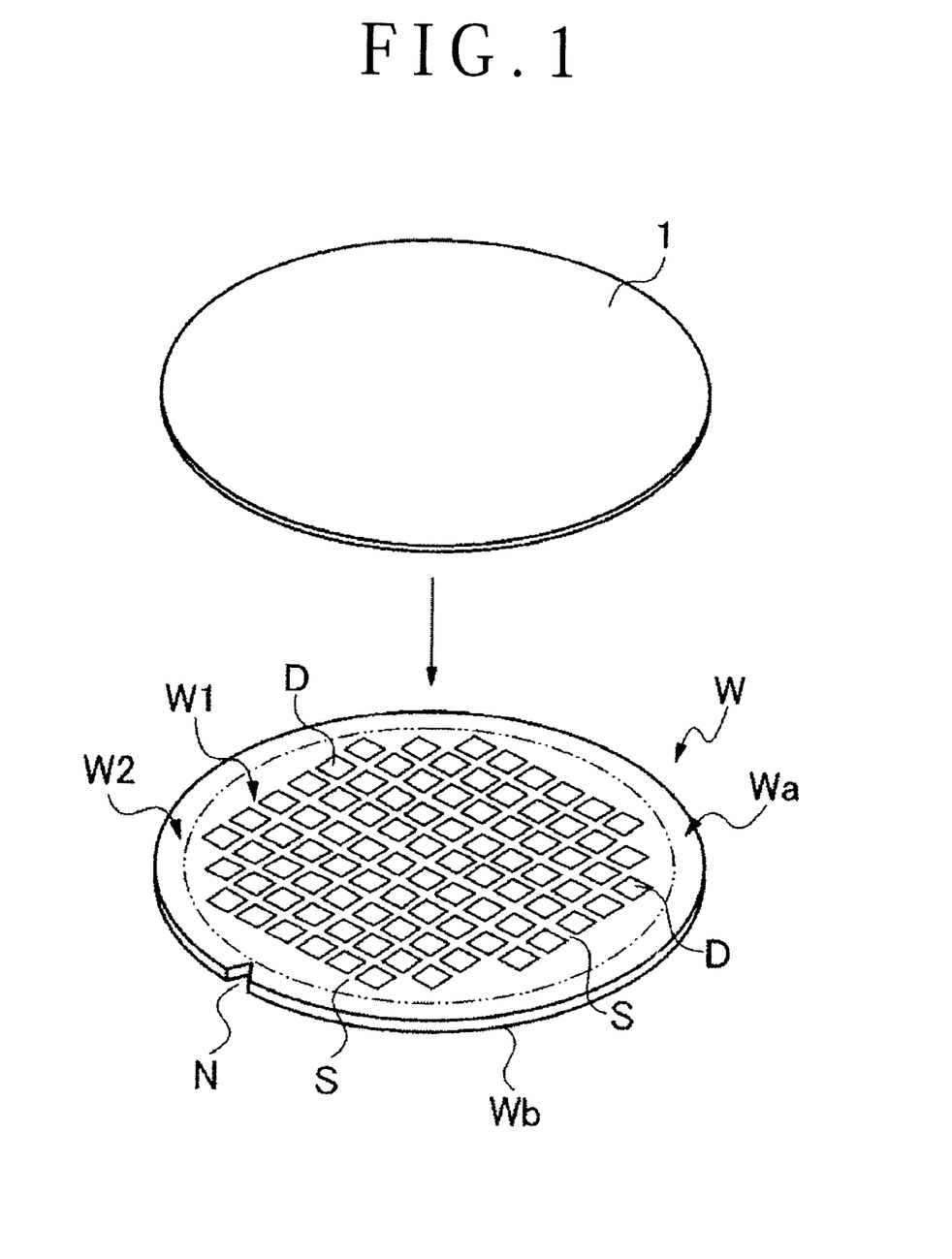
FIG. 1 is an exploded perspective view illustrating a wafer and a protection tape.

Referring to FIG. 1, a device area W1 formed with a plurality of devices D and an outer circumferential redundant area W2 surrounding the device area W1 and formed with no devices are formed on a front surface Wa of a wafer W. The device area W1 is sectioned by predetermined dividing lines S extending longitudinally and horizontally and is formed with the devices D. The wafer W shown as an example is formed on an outer circumferential portion with a notch N which is a mark for crystal orientation identification.

Figure 2:
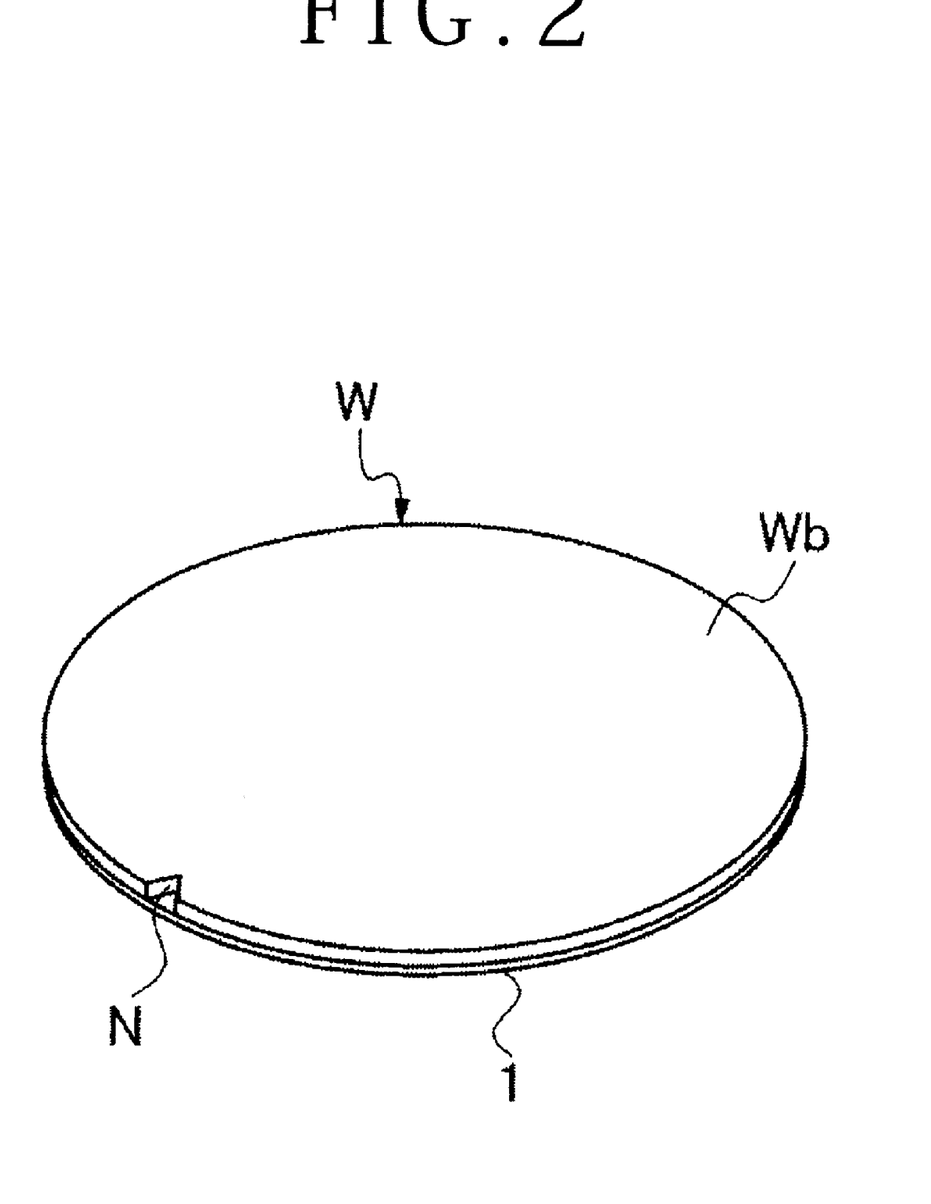
FIG. 2 is a perspective view illustrating a state where the protection tape is stuck to a front surface of the wafer.

A protection tape 1 is stuck to the front surface Wa of the wafer W1, and the wafer W1 is turned back to expose a rear surface Wb as shown in FIG. 2. The rear surface Wb is ground using e.g. a grinding device 2 shown in FIG. 3. The grinding device 2 includes a chuck table 20 holding the wafer and being rotatable therewith and a grinding means 21 for grinding the wafer. The grinding means 21 includes a spindle 22 capable of being rotated and moved up and down, a grinding wheel 23 attached to the distal end of the spindle 22 and rotated along with the rotation of the spindle 22, and a grinding stone 24 secured to the lower surface of the grinding wheel 23.

Figure 4:
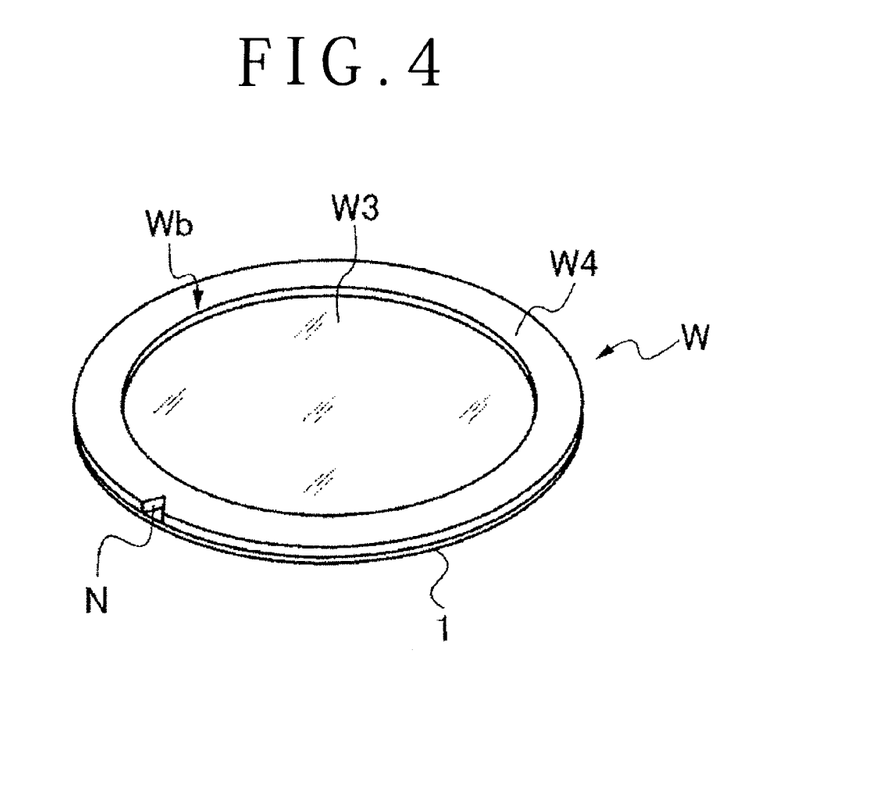
FIG. 4 is a perspective view illustrating the wafer having been subjected to the wafer grinding step.
Figure 5:
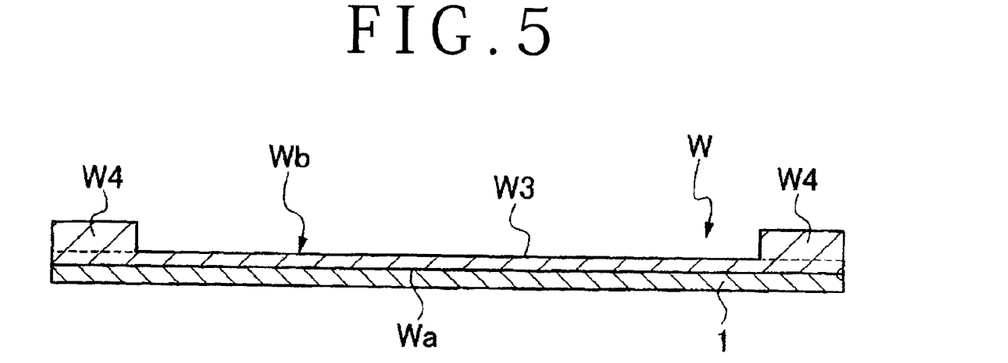
FIG. 5 is a cross-sectional view illustrating the wafer having been subjected to the wafer grinding step.

The wafer W is held on the chuck table 20 from the side of the protection tape 1 in such a manner that the rear surface Wb thereof faces the grinding stone 24. While the wafer W is rotated along with the rotation of the chuck table 20, the grinding stone 24 rotated along with the rotation of the spindle 22 is lowered and comes into contact with the rear surface Wb of the wafer W. In this case, the grinding stone 24 is brought into contact with a portion, of the rear surface Wb, corresponding to the rear side of the device area W1 (see FIG. 1) of the front surface Wa so as to prevent the other portions from being ground. In this way, as shown in FIGS. 4 and 5, a recessed portion W3 is formed at the ground portion and a ringlike reinforcing portion W4 is formed on the outer circumferential side of the recessed portion W3 at a stepped portion formed relative to the bottom surface of the recessed portion W3 (the wafer grinding step). It is desirable that the ringlike reinforcing portion W4 have a thickness of several hundreds μm. On the other hand, the thickness of the device area W1 can be reduced to e.g. approximately 20 μm to approximately 100 μm.

Figure 3:
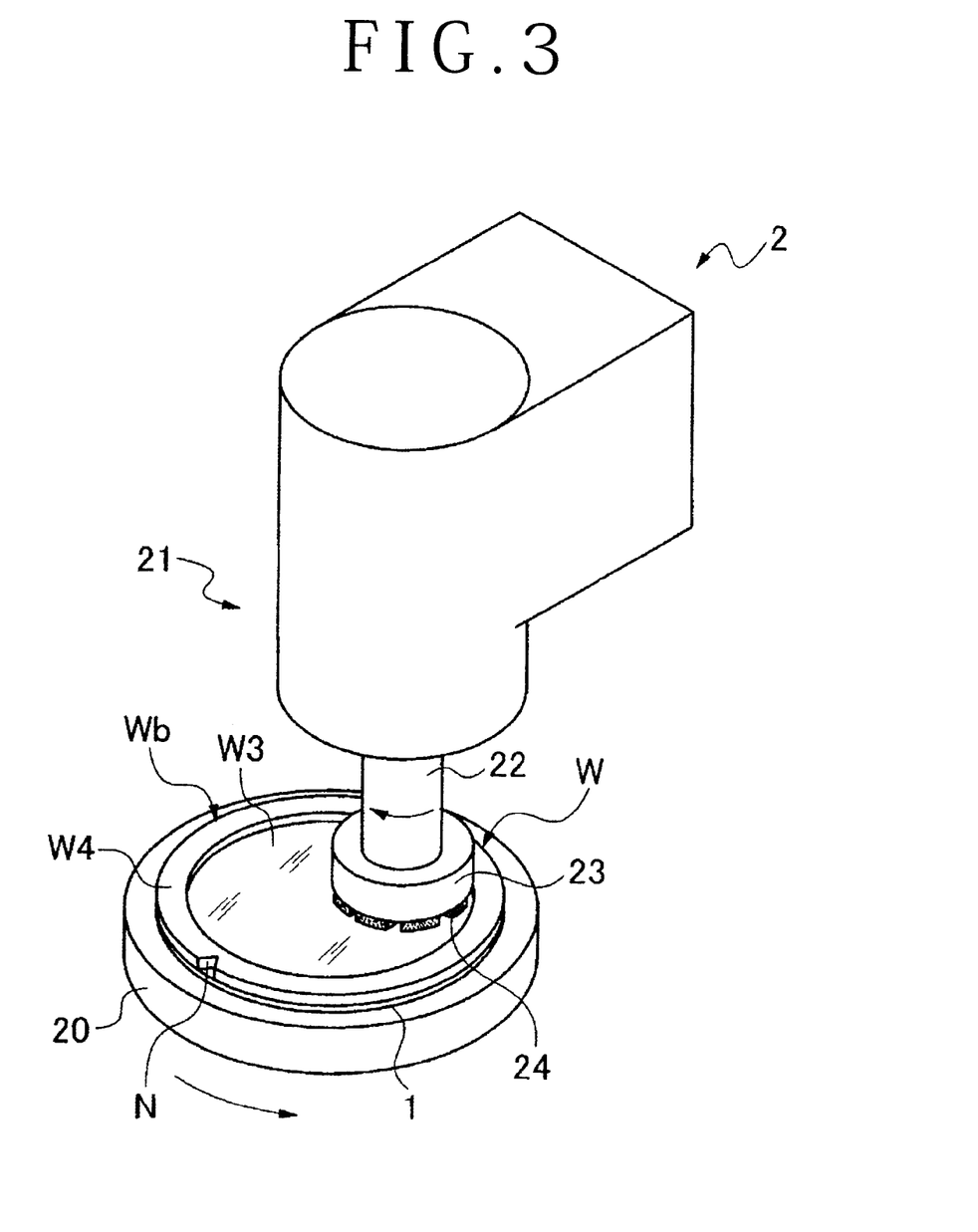
FIG. 3 is a perspective view illustrating a wafer grinding step by way of example.

Next, the wafer W together with the protection tape 1 is removed from the chuck table 20 of the grinding device 2 of FIG. 3 and the rear surface Wb of the wafer W having been subjected to the wafer grinding step is coated with a metal film composed of gold, silver, titanium or the like (the metal film coating step). Since the wafer W is formed with the ringlike reinforcing portion W4, it is easy to remove the wafer W and the protection tape 1 from the chuck table 20.

Figure 6:
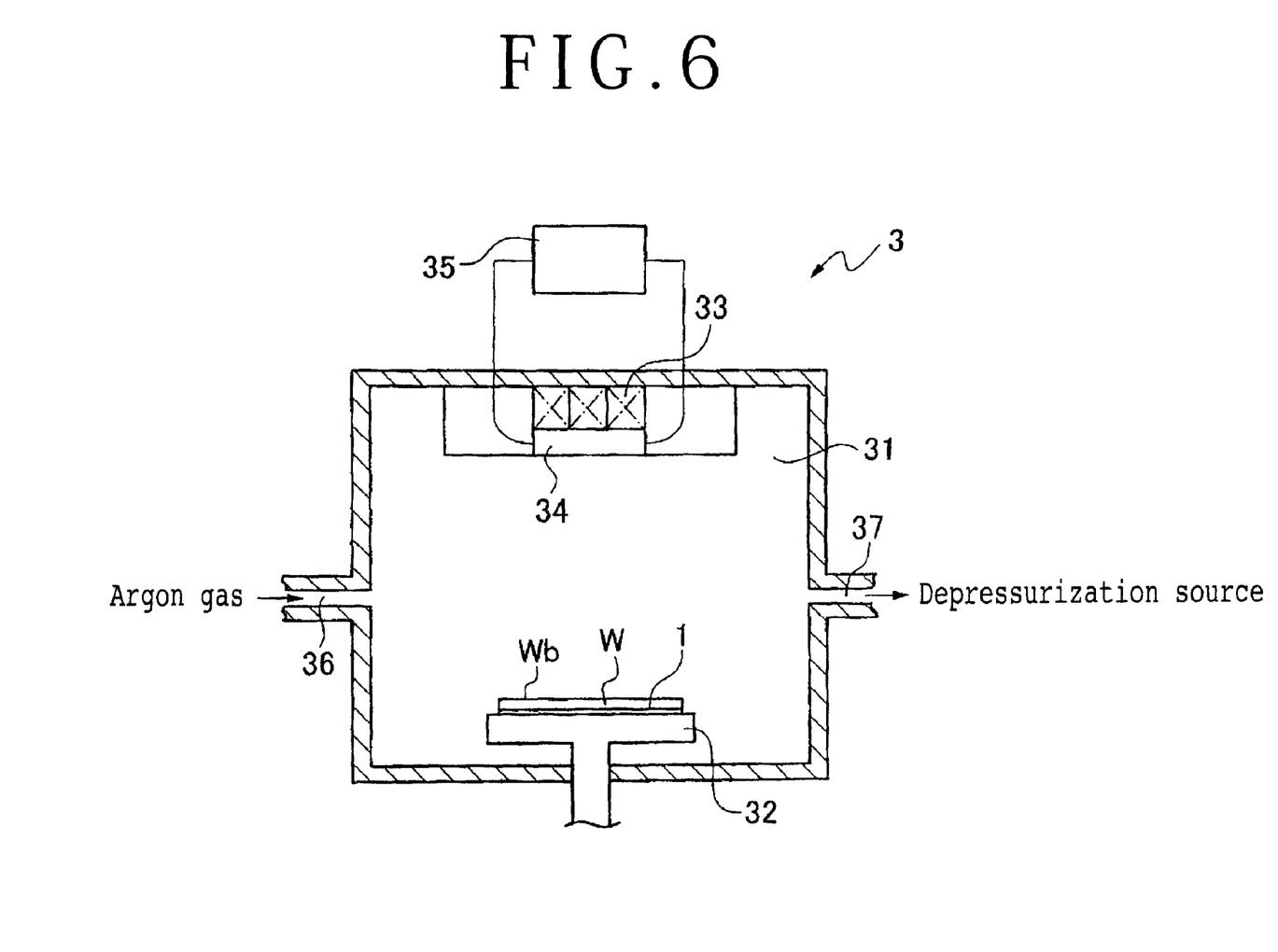
FIG. 6 is a cross-sectional view schematically illustrating a depressurization deposition device by way of example.

For example, the depressurization deposition device 3 shown in FIG. 6 can be used to perform the metal film coating step. In the depressurization deposition device 3, a holding portion 32 for electrostatically holding the wafer W is provided in the inside of a chamber 31. In addition, a sputter source 34 composed of metal is disposed at a position above and facing the holding portion 32 in such a manner as to be supported by an exciting member 33. A high-frequency power source 35 is connected to the sputter source 34. The chamber 31 is provided with an introduction port 36 adapted to introduce sputter gas at one of lateral portions and with a depressurization port 37 communicating with a depressurization source at the other lateral portion.

Figure 7:
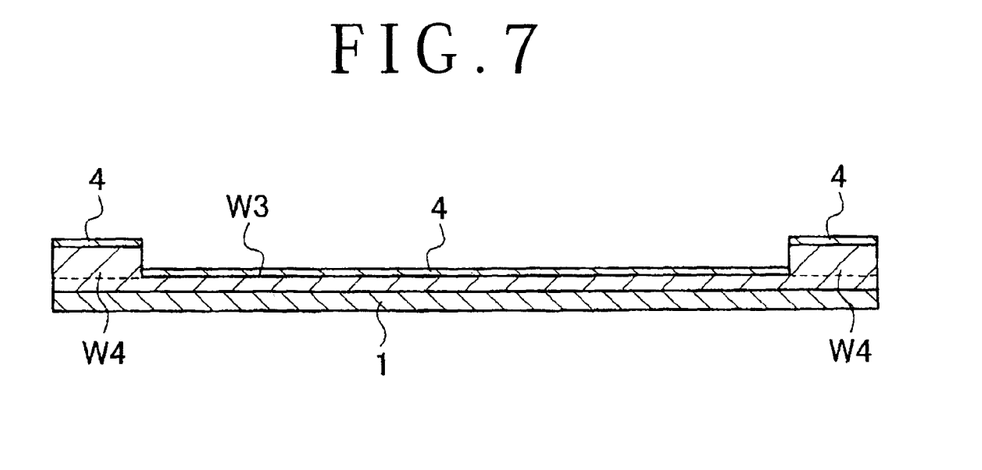
FIG. 7 is a cross-sectional view illustrating a wafer having been subjected to a metal film coating step.

The wafer W is electrostatically held on the side of the protection tape 1 by the holding portion 32 so that the rear surface of the wafer W is opposed to the sputter source 34. A high-frequency power of approximately 40 kHz is applied from the high-frequency power source 35 to the sputter source 34 magnetized by the exciting member 33. In addition, the chamber 31 is internally reduced in pressure to approximately $10^{-2}$ to $10^{-4}$ Pa through the depressurization port 37 for a depressurization environment. Argon gas is introduced from the introduction port 36 for generating plasma. In this way, argon ions in the plasma collide with the sputter source 34 to sputter and deposit particles on the rear surface of the wafer W, forming a metal film 4 as shown in FIG. 7. This metal film 4 has a thickness of e.g. approximately 30 to 60 nm. In the example shown in FIG. 7, also the ringlike reinforcing portion W4 is coated with the metal film 4. However, if the ringlike reinforcing portion W4 is subjected to masking in the metal film coating step, only the recessed portion W3 is formed with the metal film 4. The metal film coating step is performed in the state where the rear side of the device area W1 is made thinner by grinding. However, since the wafer W is formed with the ringlike reinforcing portion W4, it is easy to handle the wafer W in the metal film coating step. Incidentally, the metal film coating step can be achieved by deposition, CVD or the like.

Only pattern portions regarding recognition may be subjected to masking so as not to be coated with the metal film so that the predetermined dividing lines S can be recognized from the rear surface by an infrared camera. Examples of the pattern portions regarding recognition include the predetermined dividing lines per se as recognition targets, an intersecting portion between two predetermined dividing lines, and a key pattern serving to detect a predetermined dividing line.

The wafer W is next divided into individual devices by cutting the predetermined dividing lines S shown in FIG. 1 (the wafer dividing step). The wafer dividing step can use a laser processing device for cutting with a laser beam, a cutting device for cutting with a rotating blade, etc.

Figure 8:
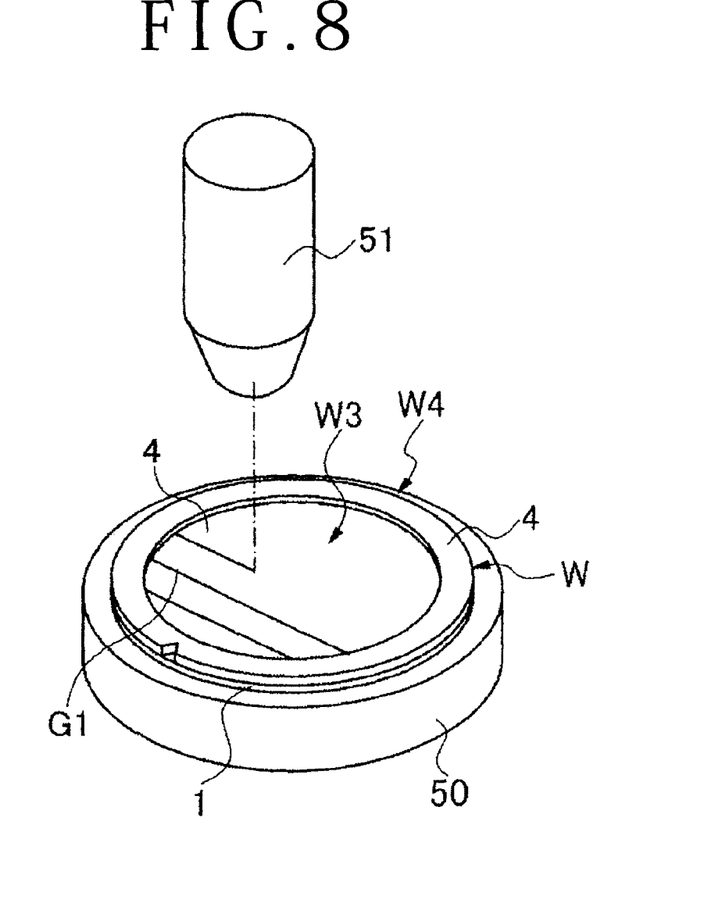
FIG. 8 is a perspective view illustrating a first example of a wafer dividing step.

If the laser processing device is used for the wafer dividing step, the wafer W is held on the holding table 50 on the side of the protection tape 1 in the state where the protection tape 1 remains stuck to the front surface Wa of the wafer W as shown in FIG. 8. The infrared camera is used to allow an infrared ray to pass through the metal film 4 and the wafer W to detect the predetermined dividing lines S formed on the front surface side of the wafer W. While moving the holding table 50 in the horizontal direction, a laser beam is emitted from a processing head 51 to the predetermined dividing lines S to form grooves G1 on corresponding predetermined dividing lines S for cutting the wafer W longitudinally and horizontally. During the cutting, it is not necessary to emit a laser beam to the ring-like reinforcing portion W4. Incidentally, due to the type or thickness of the metal film 4, it may not be possible to detect the predetermined dividing lines S formed on the rear surface side of the wafer W by means of the infrared camera. In such a case, it is necessary to expose the pattern portion regarding the recognition of the predetermined dividing line as described above.

Figure 9:
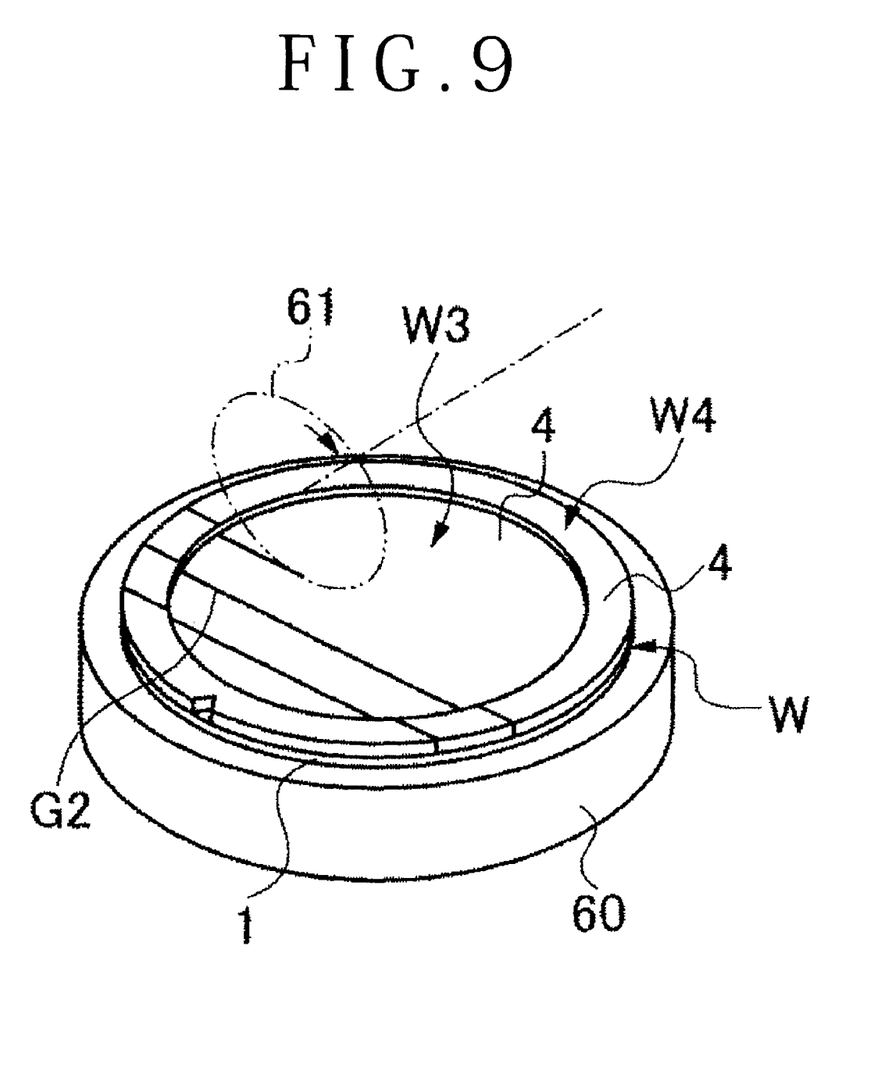
FIG. 9 is a perspective view illustrating a second example of the wafer dividing step.

If the cutting device is used for the wafer dividing step, in the state where the protection tape 1 remains stuck to the rear surface Wb of the wafer W as shown in FIG. 9, the wafer W is held on the holding table 60 on the side of the protection tape 1. The infrared camera is used to allow an infrared ray to pass through the metal film 4 and the wafer W to detect the predetermined dividing lines S formed on the front surface side of the wafer W. While moving the holding table 60 in the horizontal direction, a blade 61 rotating at high speed is cut into the predetermined dividing line S to form grooves G2 on corresponding predetermined dividing lines S for cutting the wafer W longitudinally and horizontally. During the cutting, the blade 61 is cut into also the ringlike reinforcing portion W4 to fully cut the predetermined dividing lines S.

Figure 10:
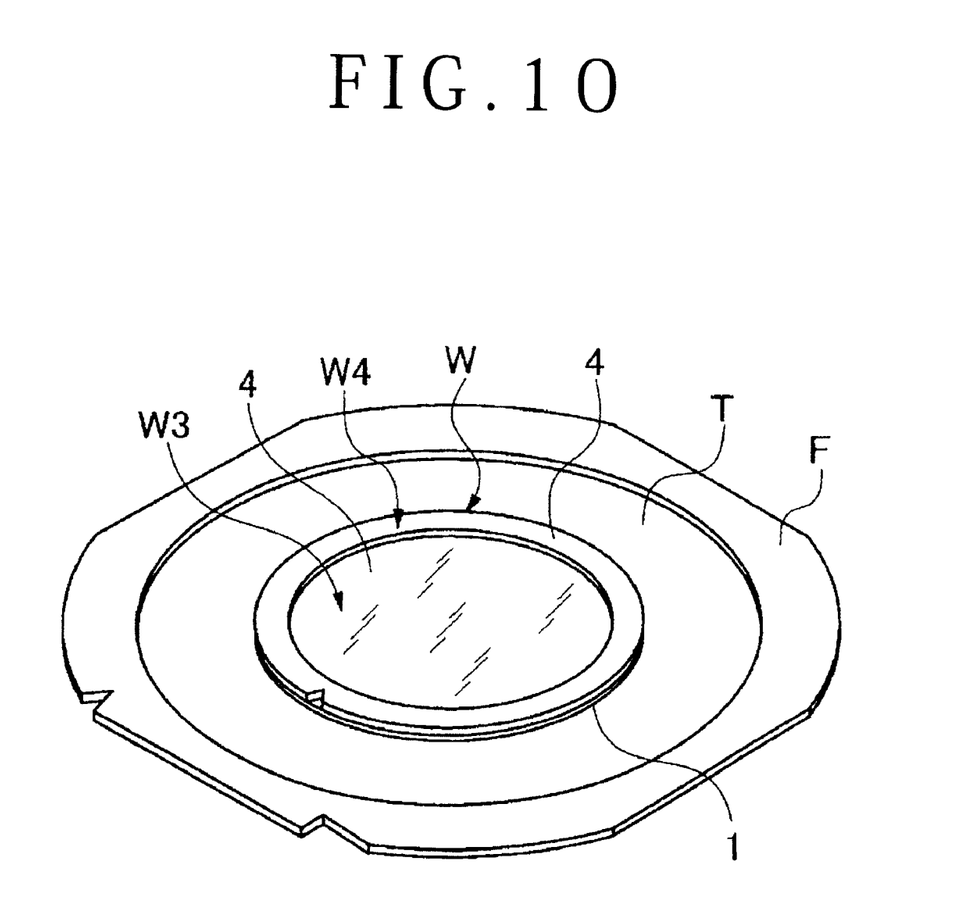
FIG. 10 is a perspective view illustrating a state where the protection tape stuck to the front surface of the wafer is stuck to a dicing tape.

When the laser processing or the processing using the blade is performed in the wafer dividing step, it can also be performed in the state where the protection tape 1 stuck to the front surface Wa of the wafer W is stuck to a dicing tape T whose circumferential edge portion is held by the dicing frame F as shown in FIG. 10. It is not necessary to peel the protection tape 1 from the front surface Wa of the wafer W in the case of using as well as not using the dicing tape T.

Figure 11:
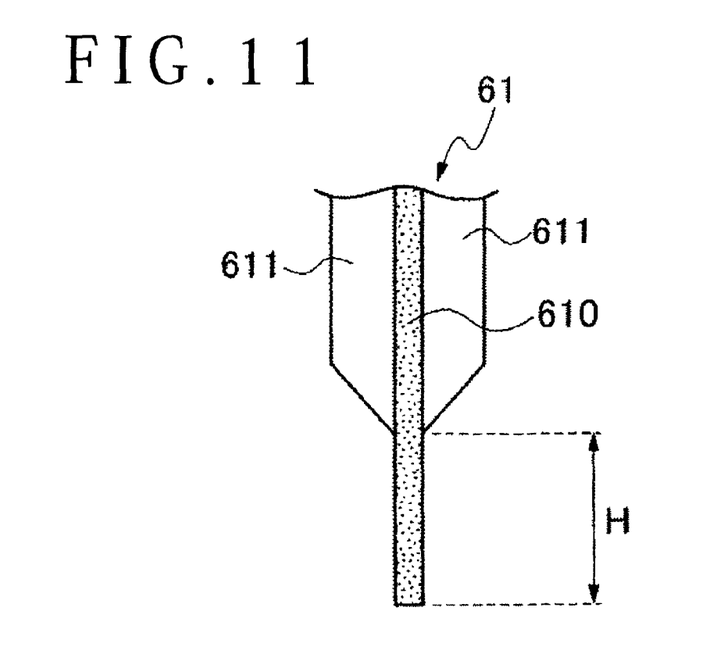
FIG. 11 is a lateral view illustrating a structure of holding a cutting part of a blade.
Figure 12:
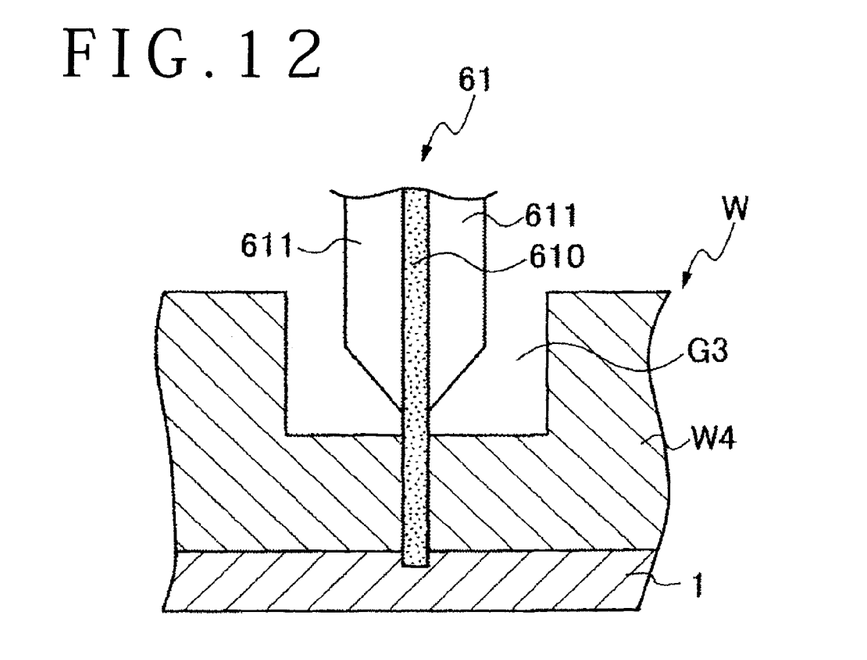
FIG. 12 is a cross-sectional view illustrating a state where the cutting part is cut into a ring-like reinforcing portion formed with a runout groove.
Figure 13:
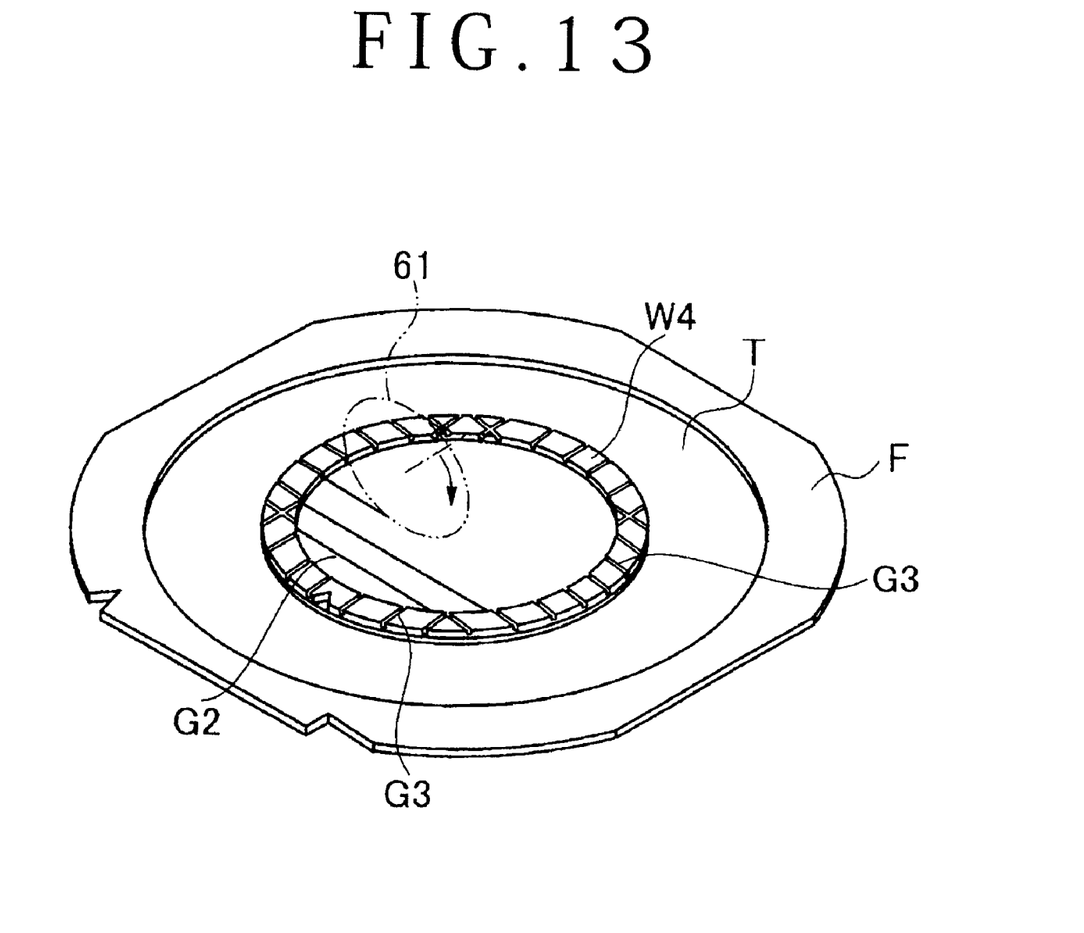
FIG. 13 is a perspective view illustrating an example of a wafer formed with a runout groove in the ringlike reinforcing portion.

Incidentally, referring to FIG. 11, the blade 61 is generally configured such that a cutting portion 610 is gripped by a base 611 so as to project by H from the base 611 toward the outer circumferential side. The width of the predetermined dividing line S is approximately several μm in many cases. To deal with this, the cutting portion 610 for cutting is formed to have thickness (e.g. 30 μm) smaller than the width of the predetermined dividing line S. To prevent the cutting portion 610 from cracking resulting from cutting, a projecting amount H of the cutting portion 610 from the base 611 is approximately 100 to 200 μm, which is smaller than the thickness of the ringlike reinforcing portion W4. Therefore, when an end portion of a predetermined dividing portion S is cut by the blade, the base 611 may probably come into contact with the ringlike reinforcing portion W4, which may interrupt the cutting of the predetermined dividing line S. To eliminate such interruption, as shown in FIGS. 12 and 13, runout grooves G3 are previously formed by use of the following blade on corresponding extensions of the predetermined dividing lines S in the ringlike reinforcing portion W4. This blade has a cutting portion thicker than the blade used to cut the predetermined dividing line S. For example, the cutting portion has a thickness of approximately 2 mm. In this way, the end portion of the predetermined dividing line S can smoothly be cut while not bringing the base 611 into contact with the ringlike reinforcing portion W4 (the runout groove forming step).

Incidentally, the ringlike reinforcing portion W4 may be removed by circularly irradiating the inner circumference thereof with a laser beam while rotating the holding table 50 or 60 shown in FIG. 8 or 9. Alternatively, the ringlike reinforcing portion W4 may be removed by cutting the inner circumference thereof by means of the blade 51. In such cases, the wafer dividing step can be performed after the removal of the ring-like reinforcing portion W4 without performing the runout groove forming step described above.

Figure 14:
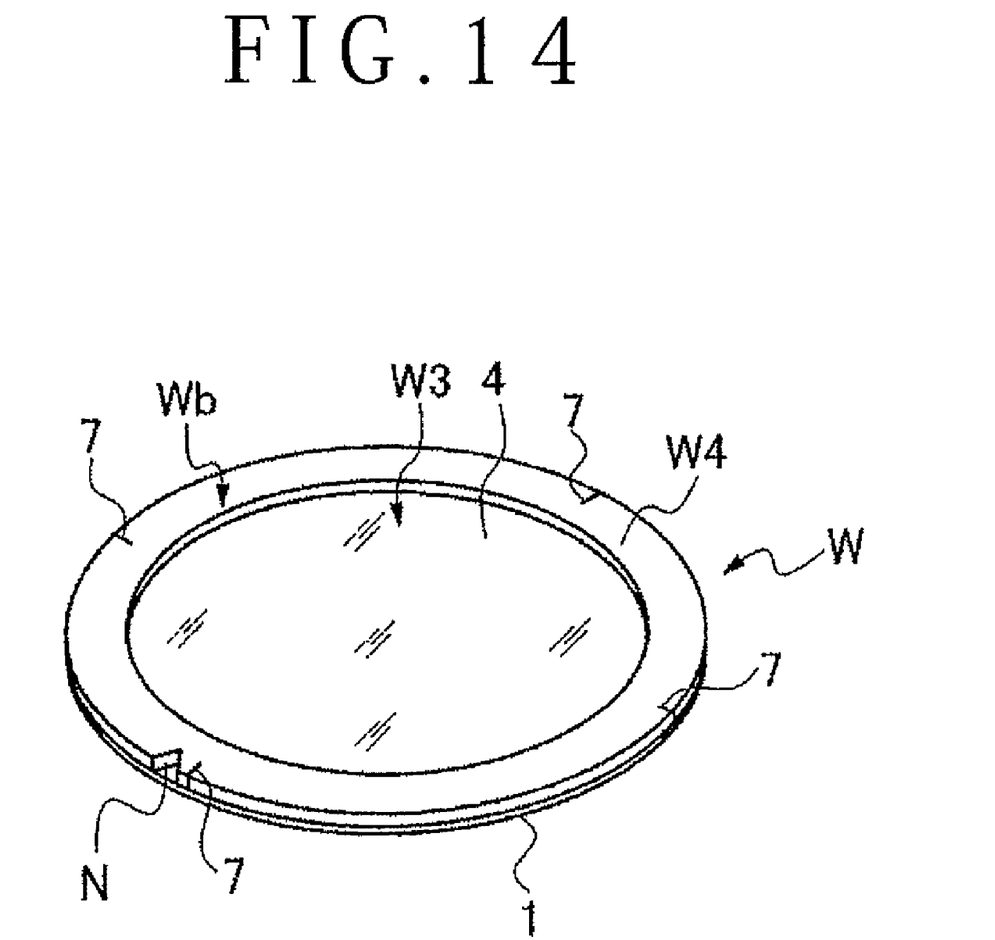
FIG. 14 is a perspective view of an example of a wafer formed with a notch in the ringlike reinforcing portion.

If the metal film 4 is formed thick in the case of using a laser beam or a blade in the wafer dividing step, the predetermined dividing line S cannot sometimes be detected by the infrared camera. In such a case, before the wafer dividing step, the predetermined dividing line S is detected from the front surface side. In addition, the predetermined dividing line S is applied with a laser beam or the blade from the front surface side to form, at the outer circumferential portion on the extension of the predetermined dividing line S, a notch 7 passing through the wafer from the front to the bottom as shown in FIG. 14. In the wafer dividing step, the predetermined dividing line S is detected by detecting the notch 7 from the rear surface side. Then, all the predetermined dividing lines are cut while, on the basis of the predetermined dividing line S thus detected, transferring the processing head 51 shown in FIG. 8 or the blade 61 shown in FIG. 9 by an interval between adjacent predetermined dividing lines. If the notch 7 is formed at two positions, i.e., at both end portions of a single predetermined dividing line, such a predetermined dividing line can be detected. The predetermined dividing lines S are formed in two directions perpendicular to each other. Therefore, it is needed only to form at least the four notches 7. Incidentally, also in the case where the predetermined dividing line S can be detected by an infrared camera because the metal film 4 is thin, the notch 7 may previously be formed.

As described above, even if the metal film is formed on the rear surface of the wafer W, by cutting the predetermined dividing lines from the rear surface side, the wafer W can be divided into the devices D in the state where the protection tape 1 remains stuck to the front surface. Thus, it is not required to remove the protection tape 1.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of dividing a wafer into individual devices, the wafer having on a front surface a device area sectioned by predetermined dividing lines to form a plurality of the devices, and an external circumferential redundant area surrounding the device area, the wafer processing method comprising:
   a wafer grinding step in which, in a state where the wafer is held on a side of a protection tape stuck to the front surface of the wafer, a rear side of the device area in a rear surface of the wafer is ground to form a recessed portion to form a ringlike reinforcing portion on an outer circumferential side of the recessed portion;
   a metal film coating step for coating, with a metal film, the rear surface of the wafer stuck with the protection tape on the front surface; and
   a wafer dividing step for cutting the predetermined dividing lines from a rear surface side of the wafer stuck with the protection tape on the front surface and dividing the wafer into individual devices, without removing the ringlike reinforcing portion.

2. The wafer processing method according to claim 1, wherein the wafer dividing step is performed after the protection tape stuck to the front surface of the wafer has been stuck to a dicing tape supported by a dicing frame.

3. The wafer processing method according to claim 1, wherein the wafer dividing step is performed by cutting the predetermined cutting lines by means of a cutting blade or a laser beam.

4. The wafer processing method according to claim 1, wherein the wafer dividing step is performed after the ringlike reinforcing portion has been removed from the wafer.

5. A wafer processing method of dividing a wafer into individual devices, the wafer having on a front surface a device area sectioned by predetermined dividing lines to form a plurality of the devices, and an external circumferential redundant area surrounding the device area, the wafer processing method comprising:
   a wafer grinding step in which, in a state where the wafer is held on a side of a protection tape stuck to the front surface of the wafer, a rear side of the device area in a rear surface of the wafer is ground to form a recessed portion to form a ringlike reinforcing portion on an outer circumferential side of the recessed portion;

a metal film coating step for coating, with a metal film, the rear surface of the wafer stuck with the protection tape on the front surface; and a wafer dividing step for cutting the predetermined dividing lines from a rear surface side of the wafer stuck with the protection tape on the front surface and dividing the wafer into individual devices, further comprising a step of forming a notch in an outer circumferential portion on an extension of the predetermined dividing line before the wafer dividing step so that the predetermined dividing line can be detected from the rear surface side of the wafer.

* * * * *